United States Patent [19]

Narayan et al.

[11] 4,376,755
[45] Mar. 15, 1983

[54] PRODUCTION OF CRYSTALLINE REFRACTORY METAL OXIDES CONTAINING COLLOIDAL METAL PRECIPITATES AND USEFUL AS SOLAR-EFFECTIVE ABSORBERS

[75] Inventors: Jagdish Narayan, Knoxville; Yok Chen, Oak Ridge, both of Tenn.

[73] Assignee: The United States of America as represented by the United States Department of Energy, Washington, D.C.

[21] Appl. No.: 344,085

[22] Filed: Jan. 29, 1982

Related U.S. Application Data

[63] Continuation of Ser. No. 240,670, Mar. 5, 1981.

[51] Int. Cl.$^3$ .......................... C01F 1/00; C01F 5/00; C01F 7/00; C01G 53/00
[52] U.S. Cl. .................................. 423/275; 126/901; 156/605; 252/62.51; 252/62.55; 423/593; 423/594; 423/600; 423/625; 423/635; 501/86; 501/94; 501/108; 501/117; 501/120; 501/127; 501/132; 501/153
[58] Field of Search ............... 423/275, 593, 600, 625, 423/635; 126/901; 501/86, 94, 108, 117, 120, 127, 132, 153; 156/605

[56] References Cited

U.S. PATENT DOCUMENTS 4,264,914  4/1981  Abraham et al. ............ 252/62.3 ZT

OTHER PUBLICATIONS

Narayan, J. et al., "Nickel Colloids in Reduced Nickel-Doped Magnesium Oxide", Physical Reviews Letters 46 (22), Jun. 1, 1981, pp. 1491-1494.
Craighead, H. et al., *Solar Energy Materials*, 1, (1979), "Metal/Insulator Composite Selective Absorbers", pp. 105-124.
Hughes, A. E., "Metal Colloids in Ionic Crystals", Advances in Physics, (1979), 28 (6), pp. 717-724; 765; 797-805.

*Primary Examiner*—Helen M. McCarthy
*Attorney, Agent, or Firm*—Fred O. Lewis; Stephen D. Hamel; Richard G. Besha

[57] ABSTRACT

This invention is a new process for producing refractory crystalline oxides having improved or unusual properties. The process comprises the steps of forming a doped-metal crystal of the oxide; exposing the doped crystal in a bomb to a reducing atmosphere at superatmospheric pressure and a temperature effecting precipitation of the dopant metal in the crystal lattice of the oxide but insufficient to effect net diffusion of the metal out of the lattice; and then cooling the crystal. Preferably, the cooling step is effected by quenching. The process forms colloidal precipitates of the metal in the oxide lattice. The process may be used, for example, to produce thermally stable black MgO crystalline bodies containing magnetic colloidal precipitates consisting of about 99% Ni. The Ni-containing bodies are solar-selective absorbers, having a room-temperature absorptivity of about 0.96 over virtually all of the solar-energy spectrum and exhibiting an absorption edge in the region of 2 μm. The process parameters can be varied to control the average size of the precipitates. The process can produce a black MgO crystalline body containing colloidal Ni precipitates, some of which have the face-centered-cubic structure and others of which have the body-centered cubic structure. The products of the process are metal-precipitate-containing refractory crystalline oxides which have improved or unique optical, mechanical, magnetic, and/or electronic properties.

14 Claims, 10 Drawing Figures

PRODUCTION OF CRYSTALLINE REFRACTORY METAL OXIDES CONTAINING COLLOIDAL METAL PRECIPITATES AND USEFUL AS SOLAR-EFFECTIVE ABSORBERS

The invention is a result of a contract with the U.S. Department of Energy.

This is a continuation of application Ser. No. 240,670, filed Mar. 5, 1981.

BACKGROUND OF THE INVENTION

1. Field of the Invention

This invention relates broadly to solid-state physics and to processes for producing ionic crystals having metal particles embedded therein. More particularly, it relates to the production of selected crystalline metallic oxides whose lattices contain dispersed precipitates of a selected metal.

2. Related Art

It is known that if colloidal precipitates having diameters in the range of about 1–200 nm are formed in ionic crystals, significant changes may take place in the physical properties of the crystals. For example, the presence of such precipitates may render the crystals useful for data-storage application or for the selective absorption of solar energy. The effects of metal colloids on ionic crystals, especially halides, are discussed in the following reference: A. E. Hughes and S. C. Jain, Adv. in Phys., 28, No. 6, pp. 717–828 (1979). Colloids of potassium, sodium and lithium have been formed in near-surface regions of MgO by ion implantation, followed by heat treatment. [M. Treilleux et al, J. Phys. Lett., Paris, 40 L-161 (1979)]. That method of forming the colloids is subject to the disadvantage that colloids are formed in only a very thin surface layer of the MgO; furthermore, subsequent annealing of the layer is required to minimize the damaging effects of the implantation.

Solar-selective films commonly are in the form of composite films which strongly absorb radiation over much or all of the solar spectrum but which are essentially transparent to longer-wavelength radiation. An ideal solar absorber has high absorption for photon wavelengths ($\lambda$) less than 2.0 $\mu$m (which band comprises most of the solar spectrum), and low absorption (or emissivity) for wavelengths exceeding 2.0 $\mu$m, so that the absorber retains the absorbed energy. Such films, referred to as cermet films, can be deposited on a low-emissivity surface, such as a metallic mirror, by electroplating or by vapor deposition. The resulting article provides a combination whose absorbance spectrum approaches the form desired for a solar-selective surface. However, cermet films are subject to one or more of the following disadvantages: they are costly to produce, their composition cannot be varied easily to provide certain desired final properties, and they do not have the stability desired for long-term operation at high temperatures. For example, electroplated chrome is a commonly used selective surface, but it does not appear to be stable at temperatures above about 300° C. Vapor-deposited composite metal insulator films are discussed in the following reference: H. G. Craigshead, R. Bartynski, R. A. Buhrman, L. Wojaik, and A. J. Sievers, Solar Energy Materials 1, pp. 105–124 (1979). That reference reports the production of Ni/Al$_2$O$_3$ and Pt/Al$_2$O$_3$ composite films by controlled co-evaporation onto fused quartz or polished Cu. The Ni/Al$_2$O$_3$ composites comprised crystalline Ni particles in an amorphous matrix. As deposited on Cu substrates, both types of film exhibited an absorptivity ($\alpha$) of $\geq 0.94$ and an absorptivity to thermal-emissivity ratio ($\alpha/E$) of $\geq 13$ at 150° C. for an extended period, whereas a deposit of Pt/Al$_2$O$_3$ remained stable at 600° C.

The growth of MgO:Ni crystals by an arc-fusion technique and the characteristics of such crystals are described in the following references: J. Narayan and Y. Chen, J. App. Phys., 51(2), 1242–43 (1980); U.S. Pat. No. 3,829,391, "Submerged-Arc Process for Growing Transparent Alkaline-Earth Oxide Single Crystals," to Yok Chen and Marvin Abraham, issued Sept. 19, 1972.

Copending, co-assigned U.S. patent application Ser. No. 973,660, filed on Dec. 27, 1978, describes a process for producing alkaline-earth-oxide semiconductors. The process comprises contacting a metal-doped crystalline alkaline-earth-oxide with an oxygen-containing atmosphere at elevated temperature to form [Li]° defects therein and then quenching the heated material to render the defects stable at room temperature. For comparison, the application cites experiments in which Li-doped MgO was contacted with reducing atmospheres at elevated temperatures and then quenched. The resulting crystals were free from [Li]° defects, virtually colorless, and transparent.

SUMMARY OF THE INVENTION

Objects

It is an object of this invention to provide a novel process for producing selected crystalline metallic oxides containing colloidal precipitates of selected metals.

It is another object to provide a process for producing crystalline oxides of the kind referred to just above, the oxides being characterized by unique physical properties—e.g., optical, magnetic, electronic, or mechanical properties.

It is another object to provide novel materials useful as solar-selective absorbers.

It is another object to provide a process for producing solar-selective absorber materials characterized by relatively high thermal stability.

It is another object to provide a process for producing solar-selective absorbers characterized by an absorption edge (relatively sharp decrease) near wavelength ($\lambda$) 2.0 $\mu$m of the solar spectrum.

It is yet another object to provide a process for forming colloidal precipitates in selected crystalline oxides, the process providing control of the size distribution of the precipitates and thus of various physical properties of the oxides.

It is another object to provide a process for rendering selected metallic oxides less prone to fracture.

It is another object to provide a process for forming magnetic material in thermally stable matrices.

SUMMARY OF THE INVENTION

In one aspect, the invention is a process for forming a solar-energy absorbent material. A metal-doped crystalline refractory oxide body is exposed to a reducing atmosphere at a superatmospheric pressure and at a temperature which effects precipitation of the metal in the crystal lattice of the body but which is insufficient to effect net diffusion of the metal out of the lattice. The body then is cooled. In another aspect, the invention is a process for treating a refractory oxide material to increase its room-temperature absorptivity over at least the visible portion of the solar-energy spectrum. The material is provided in the form of a metal-doped crystalline oxide body and then reduced as just described. In another aspect, the invention is a process for producing a refractory crystalline oxide containing a dispersion of metal precipitates. A crystalline body is formed from a refractory oxide from the group consisting of MgO, $Al_2O_3$, and $MgAl_2O_4$, the body being doped with a metal selected from Ni, Co, Cr, V, Na, K, and Li. The doped body is exposed to a reducing atmosphere at superatmospheric pressure and at a temperature defined as just above. In another aspect, the invention is a refractory crystalline oxide containing a dispersion of colloidal metal precipitates and having a room-temperature absorptivity of at least 0.95 over at least the visible portion of the solar-energy spectrum. In another aspect, the invention is crystalline MgO containing a colloidal dispersion of nickel precipitates, said precipitates being in part of the face-centered-cubic structure type and in part of the body-centered-cubic structure type.

DETAILED DESCRIPTION OF THE INVENTION

For brevity, our invention will be illustrated primarily in terms of the production of crystalline MgO having colloidal crystalline metallic nickel precipitates or aggregates embedded therein. As will be described, our process is applicable to the production of various other crystalline oxides containing other metallic precipitates. As used herein, the term "colloidal" is used to include particles having a size in the range of from about 1 to 200 nm.

EXAMPLE

Nickel-doped (100) MgO crystals were prepared by the above-referenced arc-fusion process. The starting material for the arc fusion was a compact consisting of a mixture of high-purity MgO powder and approximately 5 wt.% NiO powder. The resulting as-grown single crystal were nearly transparent, having the slightly greenish cast associated with $Ni^{2+}$ ions in substitutional sites. Spectrographic analysis showed that the crystals contained approximately 0.4 wt.% Ni. Samples were cleaved from the boule along (100) planes and thinned by conventional chemical techniques; the typical sample measured approximately $1.5 \times 1.5 \times 0.5$ cm. Electron-microscope observations showed that the as-grown samples contained no precipitates down to the microscope resolution of about 1 nm, with the exception of a very small number of precipitates at subgrain-boundary dislocations.

In accordance with the invention, MgO:Ni crystals of the kind described above were treated to induce clustering of the nickel into colloidal precipitates dispersed in the MgO matrix. That is, the samples were placed in a tantalum capsule (bomb), which then was evacuated and sealed. After sealing, the bomb was heated to 2100 K. for one hour to vaporize the magnesium metal and expose the sample crystals to strongly reducing (oxygen-gettering) magnesium vapor at a pressure at about 6 atmospheres. This was done to effect (1) removal of part of the oxygen from the MgO lattice and (2) precipitation of metallic Ni in the lattice. Immediately following this treatment, the samples typically were quenched in liquid $N_2$. The size-distribution, structure, and morphology of the precipitates may be altered by varying such parameters as the time of heating in the reducing atmosphere and the quenching rate (determined primarily by the quenching medium).

The quenched samples were removed from the bomb and analyzed by various techniques. Optical absorption spectra were measured with a Cary 17-D spectrophotometer, and magnetic scattering experiments were performed with a polarized neutron beam spectrometer. Diffraction analysis of individual precipitates was carried out using an STEM (scanning transmission electron microscope) attachment in a Phillips EM-400 analytical electron microscope, whose electron optics result in electron-probe diameters of <5 nm. The samples also were analyzed by X-ray dispersive analysis to determine the chemical composition of individual precipitates.

Figure 1:
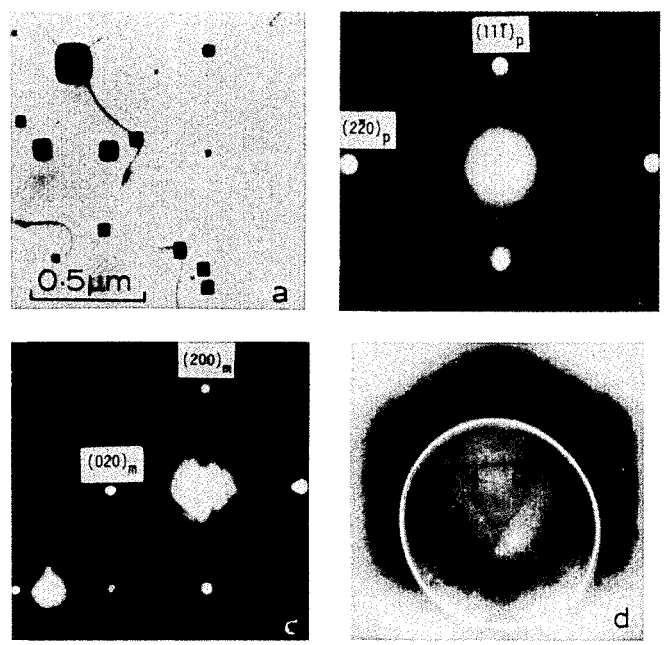
FIG. 1a is a bright-field micrograph obtained using the (200) diffraction vector (g)
FIG. 1b is a micro-diffraction pattern from an individual precipitate, the electron beam direction being close to the MgO matrix-normal [001], the precipitate being near the edge of the sample.
FIG. 1c is a diffraction pattern obtained from a precipitate inside the MgO matrix.
FIG. 1d is a convergent-beam-diffraction (CBD) pattern for the precipitate represented in FIG. 1c.
Figure 4:
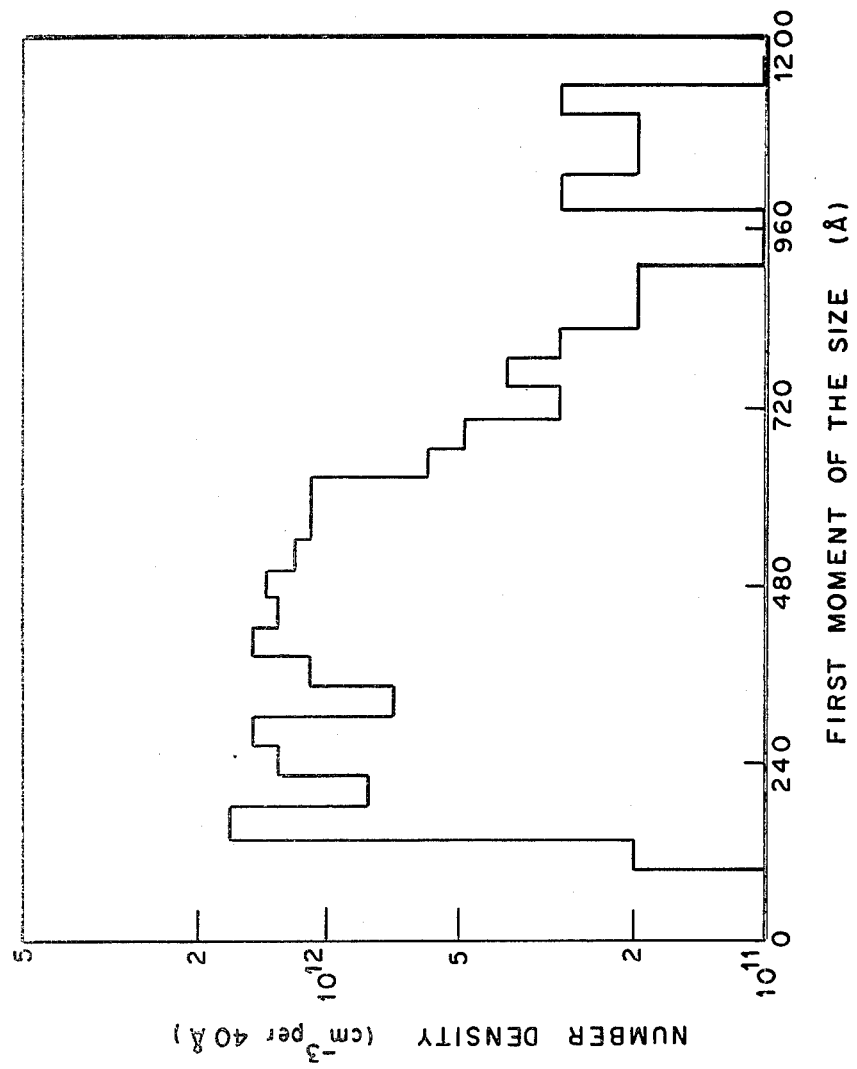
FIG. 4 is a graph correlating number density and average size (first moment of the size) for colloidal nickel precipitates formed in monocrystalline Ni-doped MgO in accordance with the invention.

FIGS. 1a–1d relate to crystal samples recovered from the tantalum bomb after exposure to the highly reducing magnesium-vapor atmosphere. As shown in FIG. 1a, the reduction produced a high concentration of precipitates, or colloids, which were observed as black spots in the bright-field electron micrograph. A fraction of these precipitates were found to be associated with the dislocations. Referring to FIG. 4, the average size (first moment) of the precipitates was 50 nm, with the number density $1.0 \times 10^{19} m^{-3}$. Stereomicroscopy and tilting experiments showed the typical colloidal precipitate, or cluster, to be a cube with truncated corners.

X-ray fluorescence studies performed on individual precipitates in the samples indicated mostly the presence of nickel. The fluorescence studies were performed on precipitates near the edge of the specimen where there was no MgO present. Integrated intensity counts on these precipitates after subtracting similar counts from the hole for the background (the microscope specimen contained a hole with a surrounding area transparent to electrons) gave a ratio for nickel of 99, indicating that the precipitates are composed of 99±1% nickel.

Figure 2:
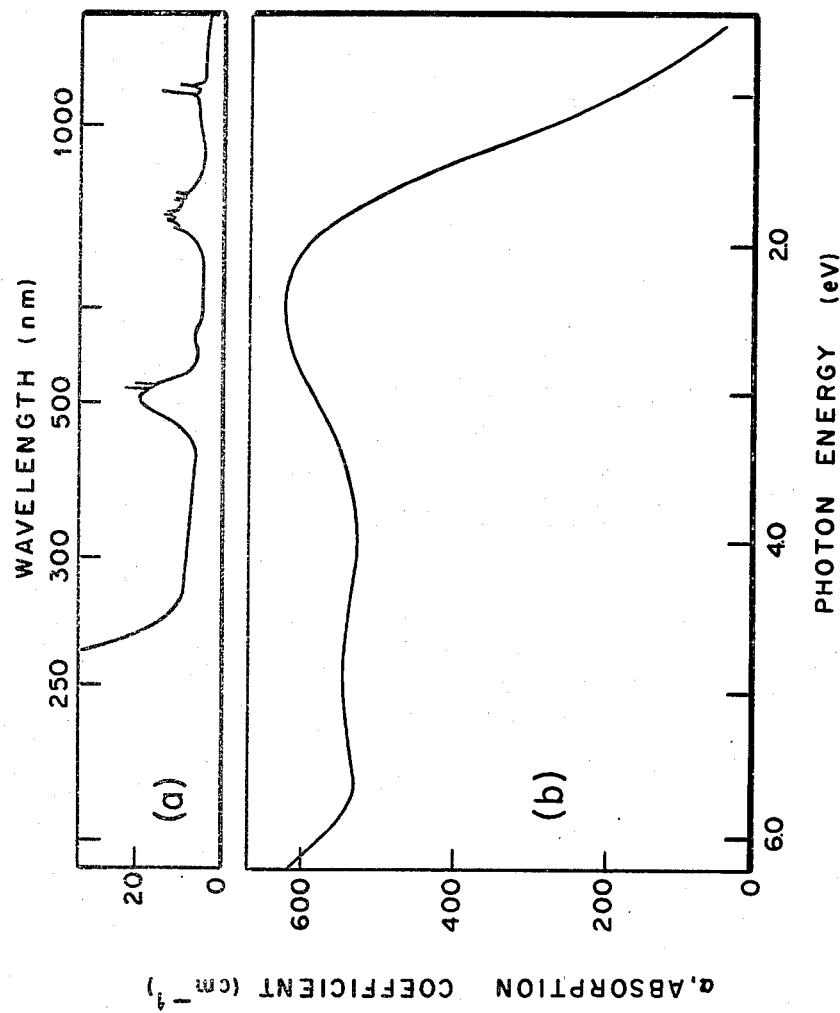
FIG. 2 is a two-section graph correlating absorption coefficient, photon energy, and wavelength for two crystal specimens; section (a) of the graph relates to an arc-fused MgO:Ni crystal prior to processing in accordance with the invention, and section (b) relates to the same crystal after such processing.

FIG. 2 depicts optical absorption spectra at 77 K. for as-grown MgO:Ni crystals of the kind described above and for the same crystals after reduction under the conditions cited. Referring to FIG. 2a, the main features of the spectrum for the as-grown crystals are due to substitutional $Ni^{2+}$ ions. Subsequent reduction caused the entire crystals to turn dark and virtually opaque. As shown in FIG. 2b, the reduced and quenched crystals exhibited a broad and intense absorption band centered near 2.2 eV; this is attributed to nickel colloids. Extremely high absorption is observed for wavelengths ($\lambda$) $\leq 2.0$ μm, which band includes the entire solar spectrum, with the visible spectrum (400–700 nm or 3.10–1.77 eV) lying in the middle. The absorptivity at room temperature for the processed crystals in this wave-length range was found to be comparable to or better than the value for chrome-black of 0.95. These crystals had low absorption or emissivity for $\lambda \geq$ about 2.0 μm; this is important for an efficient solar absorber, which must retain as much as possible of the absorbed energy. That is, as illustrated in FIG. 2b, the processed crystals exhibited an absorption edge in the vicinity of 2.0 μm. Annealing at 1073 K. of the processed crystals for a long time ($\geq 100$ hours) had little effect on the optical-absorption spectra and absorptivity-emissivity ratios ($\geq 15$). Thus, high solar intensity should not have a detrimental effect on the absorptivity-emissivity ratio of this material, and it should be suitable for solar-selective absorber applications and various photo-thermal applications as well.

Tests show that the magnetic moment associated with nickel atoms in the precipitates is only slightly lower (about 15%) than that expected for normal-stage face-centered cubic nickel. (This may be due to the presence of body-centered cubic nickel phase having different magnetic properties from fcc nickel.) Magnesium oxide (melting point 3073 K.) containing magnetic precipitates may prove to be an important magnetic material for high-temperature applications. Furthermore, the nickel-colloid containing MgO produced in accordance with our invention is more ductile than is pure MgO and less susceptible to fracture.

FIG. 1b shows a micro-diffraction pattern from a precipitate with the electron-beam direction being close to the MgO matrix-normal [001]. This precipitate was located near the edge of the specimen and thus provided diffraction information from the precipitate only. The diffraction pattern shown in FIG. 1c was obtained from a precipitate which was inside the matrix. In this case, precipitate diffraction spots (p) are similar to those in FIg. 1b, and matrix spots (m) correspond to the (001) orientation. When this specimen was tilted 19.5° around the [010] axis of the matrix, a spot diffraction pattern from the precipitate near the edge of the specimen exhibited a three or a six-fold symmetry. CBD patterns provide information on three-dimensional structure of materials and are very useful for unequivocal determination of symmetry and space groups. The indexed CBD pattern showing 539, 359, and 771 higher-order Laue zones (HOLZ) lines in FIG. 1d is exactly similar to the (111) pattern for fcc (face-centered cubic) nickel. Lattice spacings of planes ($d_{nkl}$) corresponding to various diffraction spots were determined by the relation $rd_{hkl}=C$, where r is the distance in the diffraction pattern between the central and the diffracting beams, and C is the diffraction constant measured using matrix spots or by a standard Au-specimen. Precipitate $d_{hkl}$ values obtained from diffraction patterns in different orientations are given in Table I. These $d_{hkl}$ values correspond to a simple fcc structure with a lattice constant of 0.352 nm. The symmetry and the $d_{hkl}$ corresponding to various precipitate diffraction spots in FIGS. 1b and 1c permit positive identification as the (112) pattern of fcc nickel. From these patterns the following precipitate (p) and matrix (m) orientation relationships are deduced: $[111]_p \parallel [100]_m$, and $[110] \parallel [010]_m$.

The precipitates exhibited black-white contrast under dynamical diffraction conditions indicating the presence of unrelaxed coherency strains. Moire patterns as a result of interference between (111) precipitate and (200) matrix planes are shown in FIG. 1a, which was obtained using the [200] matrix diffraction vector (g). With g=[020], precipitates with $[111]_p \parallel [020]_m$ showed similar moire fringes. These moire or interference patterns represent periodicity with which the planes at the interface of the precipitate and the matrix go in an out of register. From a moire spacing of 7.0 nm, and using a value of 0.210 nm for the matrix $d_{200}$, the $d_{111}$ for the precipitate is calculated to be 0.204 nm, which is in good agreement with the value obtained from the diffraction patterns.

Some of the reduced crystal samples were analyzed in neutron-scattering experiments, consisting of measuring the intensity in a $(111)_p$ peak when the incident neutrons were polarized parallel and then antiparallel to the sample magnetization. The precipitates were magnetically saturated by applying an external magnetic field of 12 kOe. The ratio of these intensities, which is called the flipping ratio, is given by $$R = \left(\frac{1+p/b}{1-p/b}\right)^2,$$

where p and b are, respectively, the magnetic and nuclear scattering amplitudes. The flipping ratio for the (111) precipitate reflection at room temperature results in a p/b value of 0.099±0.002, which compares with 0.119 for pure nickel metal. This difference implies that the average nickel moment in the precipitates is smaller by 17% than in pure nickel metal. This may be attributed to one or more of the following: (1) impurities in the precipitates, (2) a magnetically "dead" layer at the surface of the precipitates, or (3) the presence of other nickel phases (see below) with different magnetic properties than the fcc phase. The $d_{hkl}$ values determined from the neutron diffraction pattern for (111), (200), and (200) precipitate reflections were in excellent agreement with the values in the Table below. These experiments also gave the precipitate-matrix orientation relationship, which was the same as determined by electron microscopy.

Figure 3:
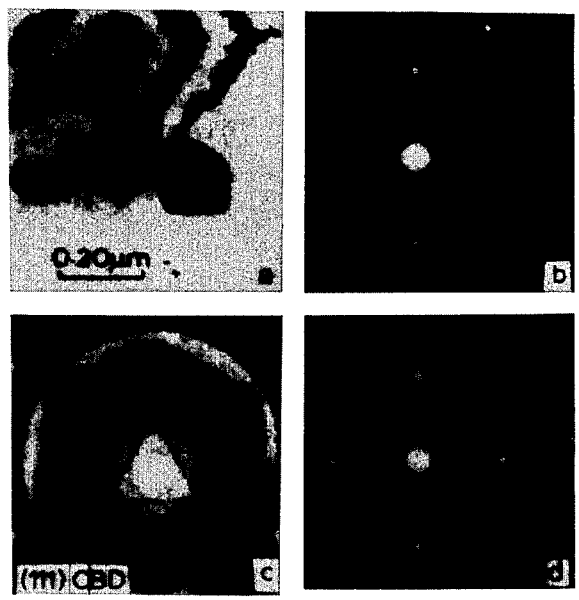
FIG. 3a is an electron micrograph of a bcc nickel precipitate in a Ni-doped MgO single crystal processed in accordance with the invention.
FIG. 3b is a diffraction pattern of a bcc nickel precipitate disposed near the edge of the crystal so treated.
FIG. 3c is a convergent-beam diffraction pattern taken in the same direction as 3b and showing a three-fold symmetry corresponding to the (111) bcc structure.
FIG. 3d is a (100) diffraction pattern obtained when the precipitate (FIG. 3c) was tilted 19.5° around the (111) pole along the (110) axis.

Some as-grown samples from the above-mentioned boule were reduced under conditions somewhat different from those described above, with the result that 5–10% of the nickel precipitates had the body-centered-cubic (bcc) structure. The as-reduced crystals were dark and essentially opaque. These samples were quenched at higher rates than the above-mentioned MgO:Ni crystals by reducing the size of the samples and the transfer time between the furnace and liquid-$N_2$ container. FIG. 3a shows a diffraction pattern from one of these precipitates. A convergent beam diffraction pattern taken in this direction is presented in FIG. 3c showing a three-fold symmetry corresponding to (111) bcc structure. When this precipitate was tilted 19.5° around the (111) pole along the (110) axis, the pattern shown in FIG. 3d was obtained. The pattern contains a four-fold symmetry corresponding to (001) orientation. The distances of the first nearest spots is the same in (111) and (100) orientations, which is a unique identifying feature of the bcc structure. Lattice spacings corresponding to the bcc structure were obtained from various diffraction spots in different orientations, and the results are also given in the Table below.

TABLE

| Face-Centered Cubic Colloidal Precipitate | | Body-Centered Cubic Colloidal Precipitates | | MgO Matrix | |
|---|---|---|---|---|---|
| hkl | $d_{hkl}$ (nm) | hkl | $d_{hkl}$ (nm) | hkl | $d_{hkl}$ (nm) |
| 111 | 0.204 ± 0.001 | 110 | 0.204 ± 0.001 | 111 | 0.242 ± 0.001 |
| 200 | 0.176 | 200 | 0.144 | 200 | 0.210 |
| 220 | 0.124 | 211 | 0.117 | 220 | 0.148 |
| 311 | 0.106 | 220 | 0.102 | 311 | 0.126 |
| 222 | 0.102 | 310 | 0.091 | 222 | 0.121 |
| 400 | 0.083 | 222 | 0.083 | 400 | 0.105 |
| | | | | 331 | 0.096 |

As mentioned, the proportion of bcc structure to fcc structure in our nickel-colloid containing MgO can be increased by increasing the quenching rate. The resulting material, which has the structure of its neighbor, iron, in the periodic table, is expected to have novel physical properties, particularly with respect to magnetism and catalysis.

In other experiments, the above-described arc-fusion process was used to produce transparent MgO crystals doped respectively with Co, Cu, Fe, and Li. The doped crystals were furnaced in reducing atmospheres at superatmospheric pressures and at temperatures sufficient to effect migration (diffusion) and aggregation of the impurity metal in the lattice but insufficient to effect net diffusion of the metal out of the MgO lattice. The reduction operation turned the virtually colorless crystals dark. After reduction, the samples were promptly quenched in liquid $N_2$ or air. The resulting crystals contained crystalline metallic precipitates having an average size in the range of from about 10 to 70 μm. Optical measurements established that the crystals were solar-selective absorbers. They exhibited an intense optical-absorption band at wavelengths (λ) below approximately 2.0 μm and a room-temperature absorptivity exceeding 0.90 for virtually all of the solar-energy spectrum, including the visible portion. In the case of the Fe and Li samples, it was noted that control of time, temperature, and pressure is especially important because the temperatures at which these impurities aggregate are close to temperatures which result in net outward diffusion of the impurities from the MgO lattice.

Referring to the experiments discussed in the preceding paragraph, the Co content of the as-fused MgO:Co crystals was approximately 0.4 at.%. The corresponding value for the Cu-containing crystals was 0.01 at.%. The MgO:Co and MgO:Cu crystals were reduced for approximately 15 minutes in Mg vapor (approximately 2000 K., approximately 5 atmospheres) in a tantalum bomb. The as-grown MgO:Fe crystals contained about 0.04 at.% Fe. These crystals were reduced in a tantalum bomb (Mg vapor, 2000 K., approximately 4 atmospheres, approximately 30 minutes). The MgO:Li crystals contained 0.05 at.% and were reduced in a tantalum bomb (Mg vapor, approximately 5 atmospheres, 1870 K.).

Referring now to our process more generally, the arc-function process referred to above is an especially suitable technique for preparing the doped crystals to be reduced in accordance with the invention. However, if desired, any other suitable techniques may be used to form the doped crystals. If desired, the crystals may be reduced in a substantially sealed graphite crucible which is mounted in any suitable furnace and surrounded by a protective gas, such as flowing $N_2$. The crystal-containing crucible contains an inert gas or a relatively non-reactive gas, such as $N_2$. The graphite acts as a reducing agent, as does CO generated by the reaction of graphite and oxygen evolved from the crystal. As indicated in the Example, losses in the crystal-forming operation may require that an excess of the dopant metal be used in the starting material for that operation. The target concentration of dopant metal in the as-grown crystal will be determined by product specifications, but should be less than the value resulting in alloy formation rather than a colloidal dispersion. For the MgO:Ni system, alloy formation may occur at nickel contents above about 1.5 wt.%. The corresponding values for other metal dopants may be obtained from standard references or be determined by routine testing.

Our invention is not limited to the production of colloidal dispersions of the particular dopants referred to above but is believed applicable to other dopants, such as Na, Cr, and V. Similarly, the invention is not limited to MgO crystal matrices but is applicable to other refractory crystalline oxides—as, for example, $MgAl_2O_4$ and $Al_2O_3$ (which, like MgO is a wide-band gap insulator). Given the teachings herein, the applicability of the invention to a given crystalline oxide can be determined by merely routine experimentation. The oxides may be either monocrystalline or polycrystalline.

As indicated, the reduction operation is conducted advantageously in a closed vessel or bomb and at superatmospheric pressures. The operating pressure may be many atmospheres. Various reducing atmospheres may be used to effect removal of oxygen from the crystal lattice and include clustering of metallic precipitates in the lattice. The term "reducing atmosphere" is used herein to include not only metal vapors but CO, $H_2$, and the like, as well as atmospheres comprising a mixture of one or more such agents and a relatively non-reactive gas, e.g., $N_2$ or an inert gas. Preferably, the reducing atmosphere is one having a high affinity for oxygen. The reduction temperature should be at a value sufficient to effect migration and precipitation of the selected metal in the crystal lattice but below the value resulting in net outward diffusion of the metal from the crystal lattice. In the case of MgO and Ni, temperatures in the range of from about 1400 K. to 2300 K. satisfy these requirements. Given the teachings herein, suitable temperature ranges for other doped crystalline oxides can be determined by merely routine experimentation.

In applications where maximum precipitation of the metal dopant is desired, superatmospheric pressures and suitable high temperatures should both be employed. Preferably, the reduction step is promptly followed by quenching in any suitable medium; if desired, however, the reduction may be followed by gradual cooling, as by permitting the reduced crystal to cool to room temperature. The more rapid the quenching rate the smaller the average size of the precipitates. Thus, the average size of the precipitates may be varied by adjusting the quenching rate and the above-mentioned parameters for the reduction operation. Other things constant, the average size of the precipitates increases with reduction temperature and pressure. In general, the optical absorption coefficient of the product material increases with dopant-metal content, temperature and pressure of reduction.

The materials produced in accordance with our invention have properties of special interest for applications involving solar-energy absorption and data storage, and have improved mechanical, electrical, and/or electronic properties which should be advantageous in various other applications. For instance, our reduced MgO:Ni material may be used as a solar-selective absorber by bonding or otherwise forming a thin layer thereof on a highly reflective metal substrate, such as copper or platinum. If desired, the layer may be formed with a concentration gradient; a lower concentration near the surface is desirable for low emissivity, and a higher concentration in the deeper regions is required for high absorption of solar energy. In another application, the reduced MgO:Ni material may be fabricated as a self-supporting panel, or the as-fused material may be formed in the desired configuration and then processed as described. As mentioned, an advantage of our process is that its parameters can be varied to control, over a limited range, the total amount of metal precipitated and the average size of the precipitates; this, in turn, permits control of such properties as optical absorption coefficient, ductility, and/or magnetic moment.

The foregoing illustrations of the invention were chosen and described to enable other skilled in the art to utilize the invention in various embodiments and with various modifications as are suited to the particular use contemplated. The illustrations are not intended to be exhaustive or to limit the invention to the precise forms disclosed, and obviously many variations are possible in the light of the above teaching. It is intended that the scope of the invention be defined by the claims appended hereto.

What is claimed is:

1. A process for treating a refractory oxide material to increase its room-temperature absorptivity over at least the visible portion of the solar-energy spectrum, said process comprising:
   providing said material in the form of a metal-doped crystalline oxide body,
   exposing said body to a reducing atmosphere at a superatmospheric pressure and at a temperature effecting precipitation of said metal in the lattice of said body but insufficient to effect net diffusion of said metal out of said lattice, and
   cooling said body.

2. The process of claim 1 wherein said metal is precipitated as colloidal particles.

3. The process of claim 1 wherein said cooling is effected by quenching.

4. The process of claim 1 wherein said exposing step is conducted in a bomb.

5. A process for producing a solar-energy absorbent material, comprising:
   providing a metal-doped refractory crystalline oxide body,
   exposing said body in a bomb to a reducing atmosphere at superatmospheric pressure and at a temperature effecting precipitation of said metal in the lattice of said body but insufficient to effect net diffusion of said metal out of said lattice, and
   cooling said body.

6. The process of claim 5 wherein said cooling is effected by quenching.

7. The process of claim 6 wherein said metal is precipitated as colloidal particles.

8. The process of claim 7 wherein the cooled body has a room-temperature absorptivity exceeding 0.90 over at least the visible portion of the solar-energy spectrum.

9. A process for producing a refractory crystalline oxide containing a dispersion of colloidal metal precipitates, said process comprising:
   forming a crystalline body of a refractory oxide selected from the group consisting of MgO, $Al_2O_3$, and $MgAl_2O_4$, said body being doped with a metal selected from the group consisting of Ni, Co, Cu, Cr, V, Li, Na, and K, and
   exposing said body to a reducing atmosphere at superatmospheric pressure and at a temperature effecting precipitation of said metal in the lattice of said body but insufficient to effect net diffusion of said metal out of said lattice.

10. The process of claim 9 further characterized by the step of cooling said body following said exposing step.

11. The process of claim 10 wherein said cooling step is effected by quenching.

12. A refractory crystalline oxide of at least one metal selected from the group consisting of Mg and Al, said oxide containing colloidal metallic precipitates and having a room-temperature absorptivity exceeding 0.90 for photon wavelengths below about 2 $\mu$m.

13. Crystalline MgO containing colloidal nickel precipitates.

14. Crystalline MgO containing a colloidal dispersion of nickel precipitates, part of said precipitates being of the face-centered-cubic structure type and another part being of the body-centered-cubic structure type.

* * * * *